(12) United States Patent
Braune et al.

(10) Patent No.: US 7,678,293 B2
(45) Date of Patent: Mar. 16, 2010

(54) COATED FLUORESCENT SUBSTANCE, LIGHT EMITTING DEVICE COMPRISING SAID SUBSTANCE AND A METHOD FOR PRODUCING SAID SUBSTANCE

(75) Inventors: Bert Braune, Wenzenbach (DE); Torsten Fries, Stadtbergen (DE); Rainer Schirmer, Türkheim (DE); Martin Zachau, Geltendorf (DE); Franz Zwaschka, Ismaning (DE)

(73) Assignees: OSRAM Gesellschaft mit beschränkter Haftung, München (DE); Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/544,497

(22) PCT Filed: Feb. 20, 2004

(86) PCT No.: PCT/DE2004/000325

§ 371 (c)(1),
(2), (4) Date: Aug. 4, 2005

(87) PCT Pub. No.: WO2004/074400

PCT Pub. Date: Sep. 2, 2004

(65) Prior Publication Data

US 2006/0078734 A1 Apr. 13, 2006

(30) Foreign Application Priority Data

Feb. 20, 2003 (DE) ................................. 103 07 281

(51) Int. Cl.
*B32B 1/00* (2006.01)
*H05B 33/00* (2006.01)
*C09K 11/08* (2006.01)

(52) U.S. Cl. .............................. 252/301.4 R; 428/690; 428/917; 313/112; 313/503; 313/506

(58) Field of Classification Search .......... 252/301.4 R, 252/301.45, 310.4 R; 428/690, 917; 313/503, 313/504, 506, 112; 257/40
See application file for complete search history.

(56) References Cited

U.S. PATENT DOCUMENTS

| 5,087,523 | A | * | 2/1992 | Sigai et al. .................. 428/404 |
| 6,077,458 | A | * | 6/2000 | Shiiki et al. ........... 252/301.4 R |
| 6,322,901 | B1 | | 11/2001 | Bawendi et al. |
| 6,565,771 | B1 | * | 5/2003 | Ono et al. ............. 252/301.4 R |
| 6,699,523 | B2 | * | 3/2004 | Park et al. .................... 427/215 |
| 6,890,593 | B2 | * | 5/2005 | Tian ........................... 427/215 |
| 2001/0008363 | A1 | * | 7/2001 | Sanghera et al. ............ 313/496 |
| 2001/0048966 | A1 | | 12/2001 | Trumble et al. |

(Continued)

FOREIGN PATENT DOCUMENTS

EP 0 257 554 A2 3/1988

(Continued)

Primary Examiner—D. Lawrence Tarazano
Assistant Examiner—Camie S Thompson
(74) Attorney, Agent, or Firm—Cohen Pontani Lieberman & Pavane LLP

(57) ABSTRACT

A coated phosphor, formed by a powder of individual grains of a phosphor as base material, the grains being coated with a coating material. The layer comprises a plurality of individual layers and is particulate in form, the individual primary particles of the layer being at least 5 nm in size. The mean layer thickness is at least 20 nm.

17 Claims, 4 Drawing Sheets

U.S. PATENT DOCUMENTS

| | | |
|---|---|---|
| 2002/0105266 A1 | 8/2002 | Juestel et al. |
| 2004/0166320 A1* | 8/2004 | Kobusch .................... 428/404 |

FOREIGN PATENT DOCUMENTS

| | | |
|---|---|---|
| EP | 1 199 757 A2 | 4/2002 |
| JP | 63-63782 | 3/1988 |
| JP | 5-93187 | 4/1993 |
| JP | 06-100859 | 4/1994 |
| JP | 09-104863 | 4/1997 |
| JP | 11-256149 | 9/1999 |
| JP | 2000 265166 A | 9/2000 |
| JP | 2002-080843 | 3/2002 |
| JP | 2002-544365 | 12/2002 |
| WO | WO 00/69986 A | 11/2000 |
| WO | WO 00/71637 A1 | 11/2000 |
| WO | WO 01/51585 A | 7/2001 |

* cited by examiner

COATED FLUORESCENT SUBSTANCE, LIGHT EMITTING DEVICE COMPRISING SAID SUBSTANCE AND A METHOD FOR PRODUCING SAID SUBSTANCE

RELATED APPLICATIONS

This is a U.S. national stage of International Application No. PCT/DE2004/000325 filed on 20 Feb. 2004.

This patent application claims priority of German Application No. 103 07 281.0 filed 20 Feb. 2003, the disclosure of which is hereby incorporated by reference.

FIELD OF THE INVENTION

The invention relates to a coated phosphor formed by a powder of individual grains of a phosphor as base material, the grains being coated with a coating material. It applies in particular to a phosphor for use in light-emitting devices, such as a lamp or an LED or a luminaire comprising these radiation sources. A further aspect of the invention relates to the production of the coated phosphor.

BACKGROUND OF THE INVENTION

EP 1 199 757 has already disclosed a coated phosphor, a light-emitting device comprising such a phosphor and a process for producing it, in which an LED and a phosphor layer are used. In one embodiment, the phosphor used is SrS:Eu, which is coated with $SiO_2$ in a layer thickness of 100 nm in order to improve the service life.

SUMMARY OF THE INVENTION

It is an object of the present invention to provide a coated phosphor formed by a powder of individual grains of a phosphor as base material, the grains being coated with a coating material which is stabilized both with respect to degradation during processing of the phosphor and during its use in a radiation-emitting device which includes the phosphor.

This and other objects are attained in accordance with one aspect of the present invention directed to a coated phosphor, formed by a powder of individual grains of a phosphor as base material, the grains being coated with a coating material. The layer comprises a plurality of individual layers and is particulate in form, the individual primary particles of the layer being at least 5 nm in size. The mean layer thickness is at least 20 nm.

The proposed stabilization facilitates the introduction of the phosphor into the device. A further factor is that this provides a means of specifically controlling the refractive index of the phosphor and matching it to its surroundings, for example a resin.

Methods which have hitherto been customary for applying the protective layers to the surface of the phosphor particles have used wet-chemical precipitations or CVD.

These processes can only be implemented with a high level of complexity and are time-consuming and expensive. Moreover, with many phosphors these processes cannot be used to apply a coating, since the phosphors are not sufficiently stable with respect to a chemical process or the heat treatment required for this purpose or because they are not suitable for a fluidized bed process on account of their grain size, grain shape or grain distribution.

The process according to the invention is based on the high reactivity of nanoscale particles, as are generally produced by flame hydrolysis. Typical BET surface areas of these particles are 30 to 500 $m^2/g$. The particles used are in particular inorganic substances, such as metal oxides, in particular oxides of Al, Si, Ti or Zr. These particles can easily be mixed with the phosphor powder, specifically by a dry route, for example in a ball mill or a tumbling mixer. This is a homogenizing mixing operation rather than a milling operation. There is no need for a wet-chemical reaction or for any heat treatment. The coating is carried out during the mixing operation on account of the large surface area and the adsorption capacity of the nanoscale material. The primary grain size of the latter typically has a mean $d_{50}$ of from 5 to 30 nm. The layer thickness on the phosphor grain is at least 20 nm, and 50 to 100 nm is typical, although significantly greater layer thicknesses are also possible.

A typical characteristic of a layer of this type applied by a dry route is its particulate nature, i.e. it is still clearly evident how the layer constituents belong to individual primary grains.

According to the invention, the phosphor grains are coated with inorganic particles on the nanometer scale, in which case the resulting layer thickness may comprise a plurality of individual layers of these particles. This coating can be realized by a simple dry-mixing process. The particles of the coating material may be hydrophilic or hydrophobic.

In the case of the known coatings produced by precipitation or CVD, the layer thicknesses are highly uniform. This means that there is a risk of cracks readily forming in the layer if the coefficients of thermal expansion of grain and layer material are not well matched to one another. By contrast, inhomogeneous layers are relatively insensitive in this respect, since their nature is marked predominantly by the primary grains in the coating.

An additional factor is the correct choice of the actual phosphor. Whereas certain phosphors, such as for example Sr-sulfide:Eu cannot be sufficiently stabilized even by means of coating, a surprising level of success can be achieved for other phosphors. This applies in particular to chlorosilicates, thiogallates and aluminates.

Examples of the original phosphors are moisture-sensitive phosphors with a hydrophilic surface for use in LEDs (typical excitation between 350 and 490 nm), for example chlorosilicate, such as the known chlorosilicate:Eu or chlorosilicate:Eu,Mn, as disclosed by DE 100 26 435, or thiogallates as are known from DE 100 28 266. This may be damaged by moisture and temperature during processing, in particular as a result of the diffusion of moisture into the resin in the presence of blue radiation, as is often employed as the primary emission from an LED when a device of this type is operating. Furthermore, the introduction of the hydrophilic phosphors into a hydrophobic resin leads to agglomeration and increased sedimentation.

A phosphor with coating which have proven particularly successful for lamp applications (typical excitation at 150 to 260 nm) is strontiumaluminate, in particular the known Sr4Al14O25:Eu for use in Hg low-pressure fluorescent lamps or Hg high-pressure discharge lamps. Specific examples of coating materials include:

nanocrystalline $Al_2O_3$ produced by flame hydrolysis, in particular the $Al_2O_3$ supplied by Degussa under trade name Aluminiumoxid C (Alon C);

hydrophilic or hydrophobic Aerosils, type $SiO_2$, and other pyrogenic silicas;

nanoscale phosphors, such as for example nano-Y2O3:Eu.

The particular advantage of these coatings is that they improve the uniform introduction of the phosphors into other hydrophobic media, such as for example the epoxy resin in the case of LEDs, which is virtually imperative if a high-quality LED is to be achieved. One specific example is hydrophobic Aerosil.

If the coating is carried out using nano-$TiO_2$ or other materials with a high refractive index, such as $ZrO_2$, the nanolayer forms a zone with a mean refractive index which is between that of the phosphor and that of the surrounding medium (resin), with the result that reflexion losses are reduced. Specific examples of phosphors which are suitable for coating include YAG:Ce, TbAG:Ce, chlorosilicates and thiogallates, in particular Mg-containing thiogallates.

The layer described here may also be applied as a second layer to a grain which has already been provided with a primary coating. In this case, the term grain is to be understood as meaning the original grain including its primary coating.

BRIEF DESCRIPTION OF THE DRAWINGS

The invention is to be explained in more detail below on the basis of a number of exemplary embodiments. In the drawings.

PREFERRED EMBODIMENT OF THE INVENTION

Figure 1:
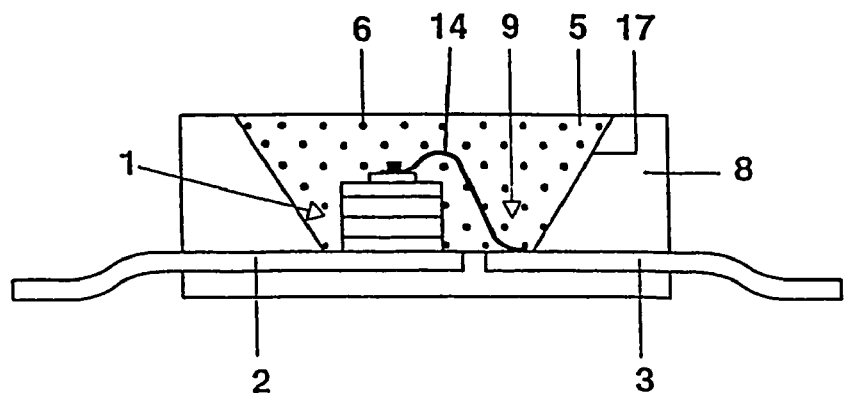
FIG. 1 shows a semiconductor component which serves as a light source (LED) for white light.

By way of example, a structure similar to that described in U.S. Pat. No. 5,998,925 is deployed for use in a white LED together with a GaInN-Chip. The structure of light source of this type for white light is specifically shown in FIG. 1. The light source. is a semiconductor component (Chip 1) of InGaN type with a peak emission wavelength of 460 nm and a first and second electrical terminal 2,3 embedded in an opaque basic housing 8 in the region of a recess 9. One of the terminals 3 is connected to the chip 1 via a bonding wire 14. The recess has a wall 17 which serves as reflector for the blue primary radiation of the chip 1. The recess 9 is filled with a potting compound 5 which as its main constituent contains an epoxy casting resin (80 to 90% by weight) and phosphor pigments 6 (less than 15% by weight). Further small amounts are made up, inter alia, of methyl ether and Aerosil. The phosphor pigments are a mixture of a plurality of pigments, including sulfides.

Figure 2:
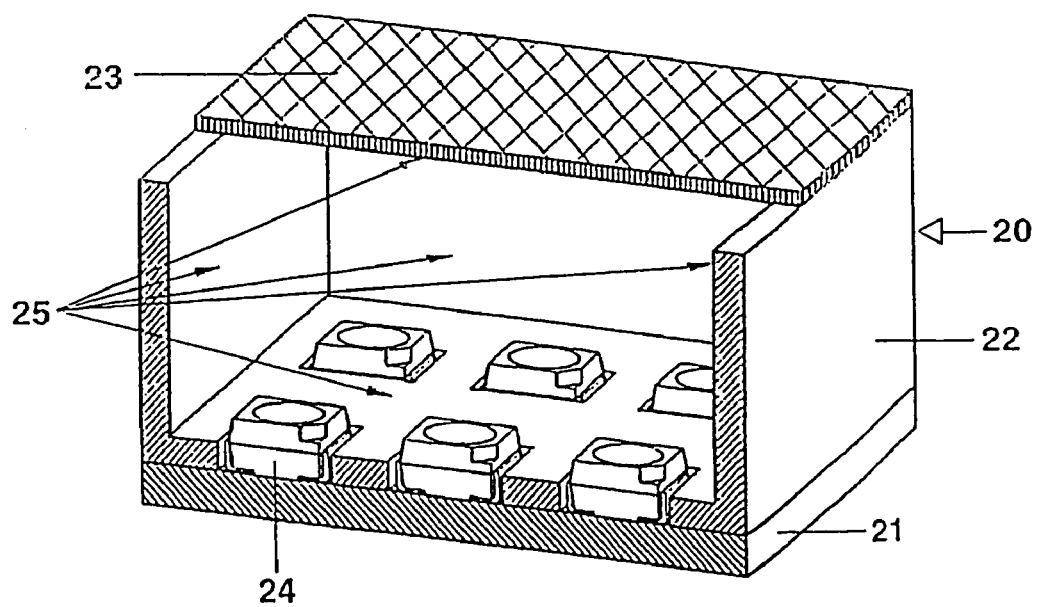
FIG. 2 shows an illumination unit with phosphors in accordance with the present invention.

FIG. 2 shows an excerpt from a surface-lighting fitting 20 as an illumination unit. It comprises a common support 21, to which a cuboidal outer housing 22 is adhesively bonded. Its upper side is provided with a common cover 23. The cuboidal housing has cutouts in which individual semiconductor components 24 are accommodated. They are UV-emitting light-emitting diodes with a peak emission of 380 nm. The conversion into white light takes place by means of conversion layers which are positioned directly in the casting resin of the individual LEDs, similarly to the arrangement described in FIG. 1, or layers 25 which are arranged on all surfaces which are accessible to the UV radiation. These include the inner surfaces of the side walls of the housing, of the cover and of the base part. The conversion layers 25 consist of three phosphors which emit in the yellow, green and blue spectral regions using the phosphors according to the invention.

The phosphors according to the invention are, for example, chlorosilicates of type $Ca_{8-x-y}EuxMnyMg—(SiO_4)4Cl_2$ with $0 \leq y \leq 0.06$ which are stabilized by a 35 nm thick coating of Aerosil R 812 produced by Degussa. This results in maintenance which is improved by at least 5% compared to uncoated chlorosilicate. The term maintenance denotes the drop in light flux after 1000 operating, hours at 80° C. and 80% atmospheric humidity. The Aerosil R 812 was produced by flame hydrolysis. Production involves simply mixing the two components, phosphor and Aerosil, for 20 hours in the tumbling mixer.

A further example is $Sr_4Al_{14}O_{25}$:Eu which has been coated with hydrophilic Alon C ($Al_2O_3$). It is used for Hg low-pressure fluorescent lamps, for example T8 lamps of the 36 W type. The phosphor-water suspension is produced in the usual way. It reveals an increase in the light flux of typically 10% after 100 h. In particular, it is possible to record an improvement of up to 17% of the initial light flux or the light flux after 100 operating hours with a very slight drop in light flux under the same measurement conditions.

In one specific exemplary embodiment, the phosphor-induced light yield after 100 hours was 113.3% for the uncoated phosphor (based on a standard value of 100%), whereas under otherwise identical conditions an Alon C coating gave a value of 123.3%, i.e. an increase of around 9%. The light loss caused by the phosphor was 1.4% in the case of an uncoated phosphor, whereas a slight increase of 0.3% was actually observed with a coated phosphor.

Figure 3:
FIGS. 3 and 4 show an SEM image of uncoated and coated phosphor in accordance with the present invention.
Figure 4:
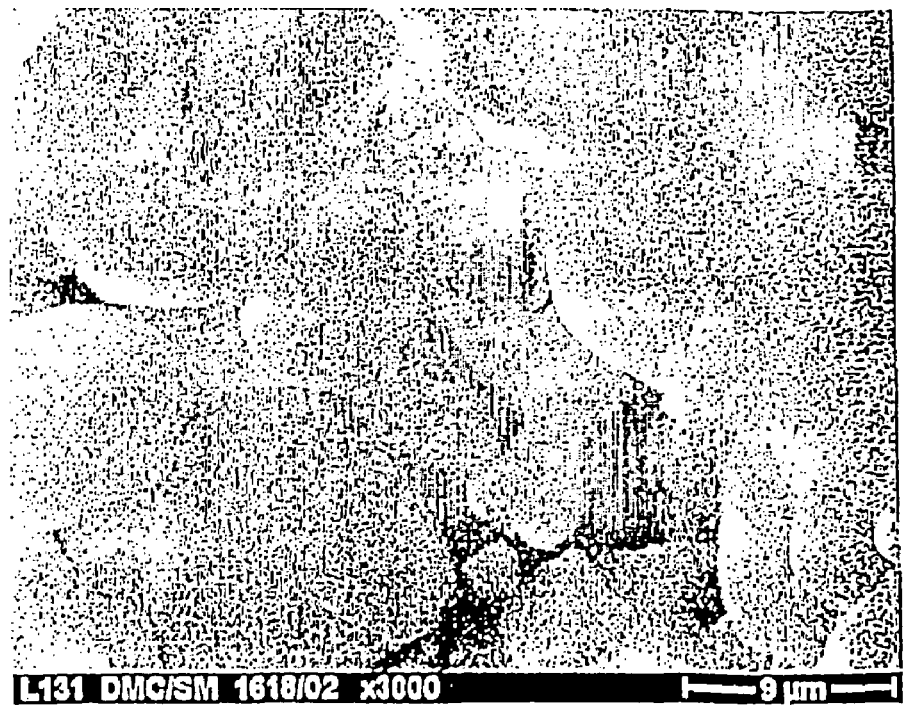

FIG. 3 shows an uncoated phosphor powder for comparison with a phosphor powder which has been coated in accordance with the invention (FIG. 4), in each case as an SEM image with 5000 times magnification. The particulate nature of the layer is clearly apparent from FIG. 4. It acts as a sponge with pores or also as fungal growth on the base material compared to the clear contours of the untreated grains of the base material, cf. FIG. 3. Both figures are taken on the same scale of enlargement. The particulate nature of the layer means in particular that the layer on the grains of the base material is inhomogeneous and the structure of its primary particles is still readily apparent, resembling a pile of boulders made up of individual rocks. Depending on the scale of magnification, it may also seem slightly smoothed, as if grass had grown over it. The structure produced by the primary particles of the layer is significantly smaller than the typical diameter of the base material. A scale difference by a factor of 100, or at least a factor of 10, between the particles of the base material and of the coating material is typical. The primary particles of the coating material lump together in an inhomogeneous way, which contrasts with processes that form homogeneous layers, such as CVD or organic coating. The primary particles in this case lump together to form aggregates and agglomerates. The possibility of a small proportion of the surface of the base material remaining free of the coating is also not ruled out. However, it is advantageous for the entire surface to be coated with at least one individual layer, which can be achieved, for example, by continuing dry mixing for a suitable length of time. The layer thickness is very variable and is best described by the mean layer thickness over a predetermined surface area, which can be derived, for example, from the applied weight per unit area. As seen on the scale of the primary grain size, the layer thickness varies considerably, as with a honeycomb structure or a surface covered with coarse mesh in a plurality of layers.

Figure 5:
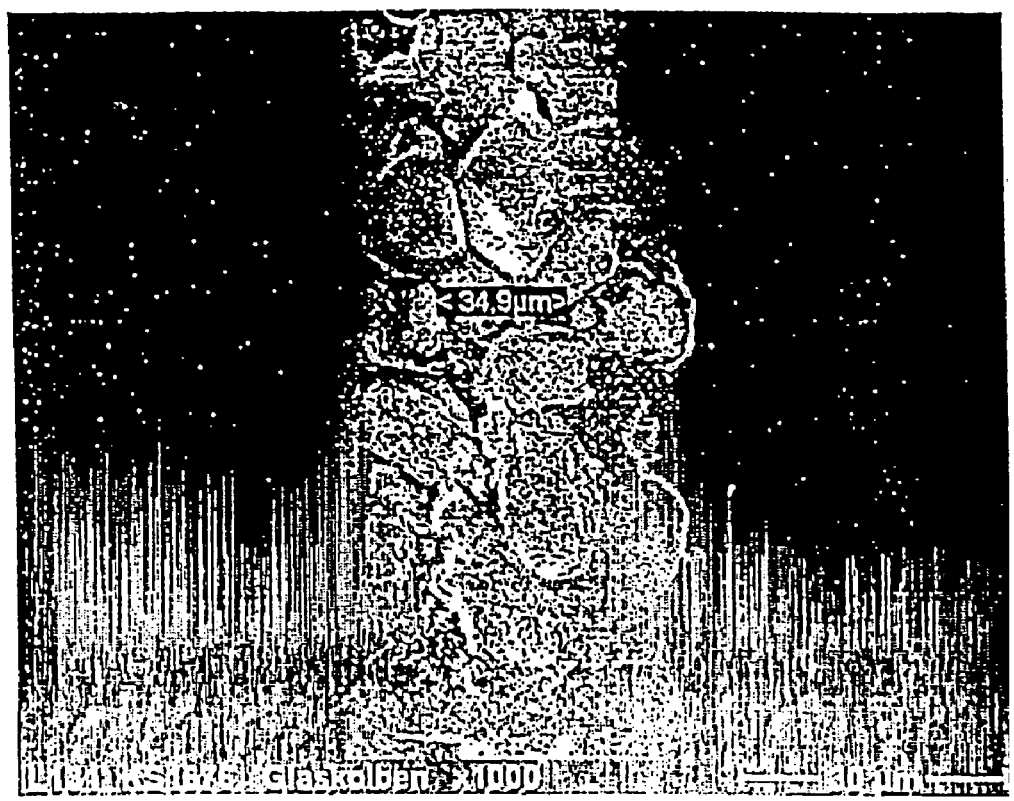
FIG. 5 shows an SEM image of coated phosphor in accordance with the present invention after it has been installed in a lamp.

FIG. 5 shows the phosphor after application to the glass bulb of a fluorescent lamp. Although the phosphor has only been dry-mixed with the coating material, its adhesion is so great that it survives the process of lamp production as a coating. This property is attributable in particular to the small size of the primary particles of the layer and their associated high reactivity.

Figure 6:
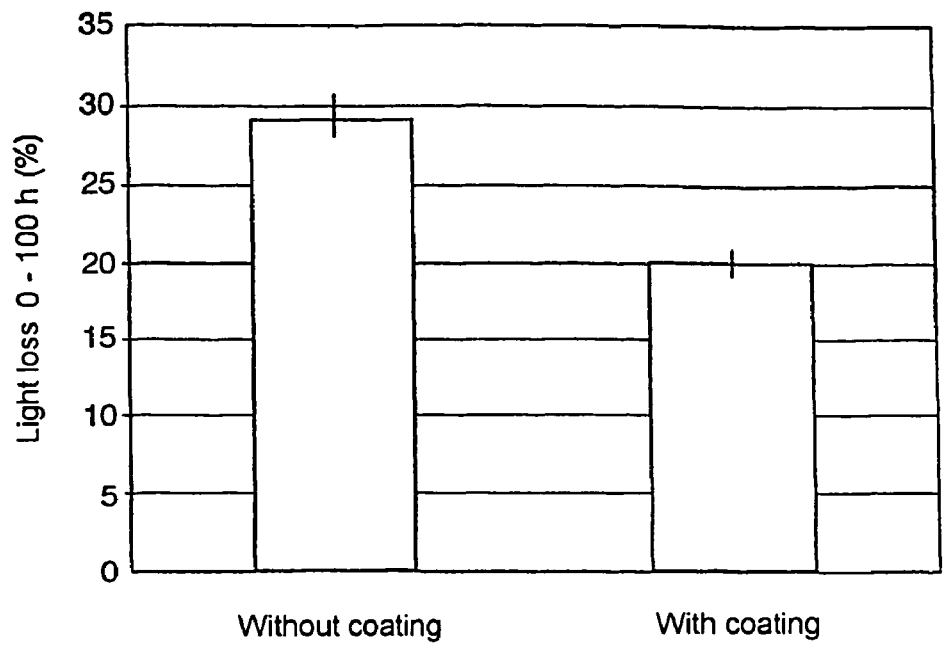
FIGS. 6 and 7 show a comparison of the light loss and light flux in lamps with uncoated phosphor and coated phosphor.
Figure 7:
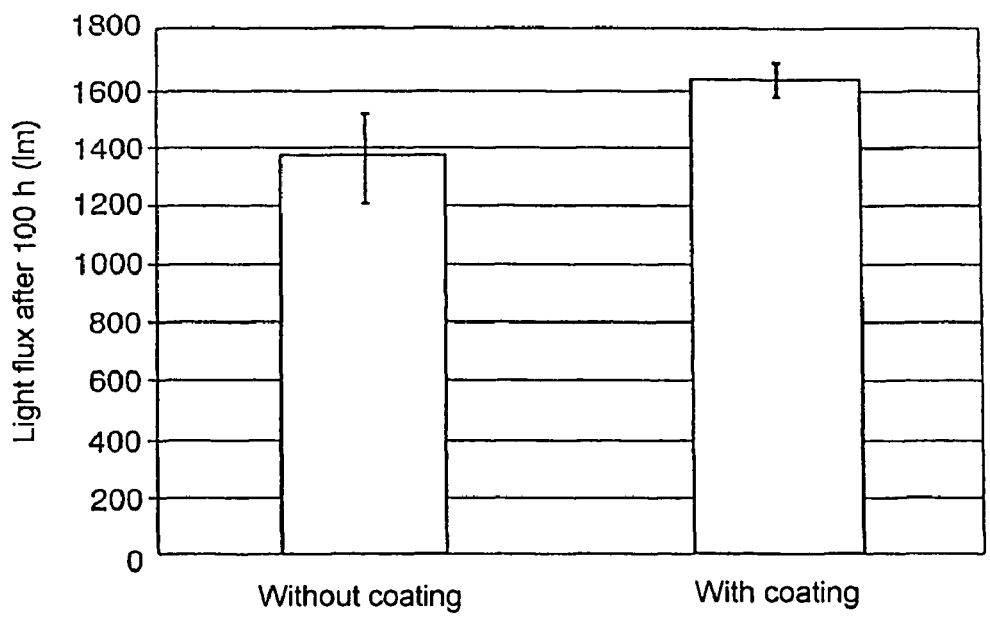

A test carried out on a T5 fluorescent lamp with a power of 28 W reveals a clear improvement as a result of the phosphor being coated. FIGS. 6 and 7 indicate the light loss after 100 hours compared with the original value in percent of the original value and the absolute value of the light flux after 100 hours in lumen. The phosphor used for the base material is Sr-aluminate:$Eu^{2+}$. The coating which has been applied to the grains of the phosphor by means of dry coating is Alon C. The light loss of the lamps with uncoated phosphor after 100 hours is significantly higher, approximately 29%, than that of the lamps with a coated phosphor, in which it is only approximately 19%; cf. in this respect FIG. 6. The absolute value for the light flux is already significantly lower after 100 hours in the lamps with an uncoated phosphor than in the lamps with a coated phosphor. Similar tests were carried out with T5 lamps with a higher loading, power level 54 W. They tended to have the same characteristics, albeit to a less pronounced extent. The light loss from these lamps with uncoated phosphor after 100 hours is higher, approximately 24%, than that of the lamps with coated phosphor, in which it was only approximately 21%.

The mixing time for the starting materials, namely the base material and the coating material, should be between 5 and 30 hours, depending on the type and condition of the materials.

The size of the grains of the base material is typically in the micrometer range, in particular with a d50 value in a range from 1 to 10 μm.

The invention claimed is:

1. A coated phosphor, comprising:
   a powder of individual grains of a phosphor as base material, the grains being coated with a non-conductive external layer of a coating material, the phosphor being excitable by ultraviolet or visible radiation,
   wherein the non-conductive external layer has an inhomogeneous thickness with a mean layer thickness of at least 20 nm and comprises a plurality of individual layers, each of the individual layers comprising the coating material and being particulate in form, the individual primary particles of the non-conductive external layer being at least 5 nm in size, and at least some of the individual primary particles of the coating material of the non-conductive external layer are lumped together to form aggregates and agglomerates thereby forming the inhomogeneous thickness of the non-conductive external layer.

2. The coated phosphor as claimed in claim 1, wherein the phosphor of the base material is selected from the group consisting of garnets, chlorosilicates, thiogallates, and aluminates.

3. The coated phosphor as claimed in claim 1, wherein the coating material comprises an inorganic material.

4. The coated phosphor as claimed in claim 3, wherein the BET specific surface area of the coating material is between 30 and 500 $m^2/g$.

5. The coated phosphor as claimed in claim 1, wherein the coating material comprises a material from the group of metal oxides produced by flame hydrolysis.

6. The coated phosphor as claimed in claim 5, wherein the mean grain size of the primary particles of the non-conductive external layer, which is to be understood as meaning the d50 value of the primary grain, is at most 30 nm.

7. The coated phosphor as claimed in claim 5, wherein the mean grain size of the primary particles of the non-conductive external layer, which is to be understood as meaning the d50 value of the primary grain, is at most 15 nm.

8. The coated phosphor as claimed in claim 5, wherein the metal for the metal oxides is one of the group consisting of Aerosil and Alon C.

9. The coated phosphor as claimed in claim 1, wherein the coating material comprises a metal oxide of a metal from the group consisting of Al, Si, Ti, Zr, Y.

10. The coated phosphor as claimed in claim 1, wherein the coating material comprises a phosphor.

11. The coated phosphor as claimed in claim 1, wherein the mean layer thickness is between 40 and 200 nm.

12. The coated phosphor as claimed in claim 1, wherein the coating material comprises a Y2O3:Eu phosphor.

13. The coated phosphor as claimed in claim 1, wherein the entire surface of the grains of the phosphor base material is coated with the non-conductive external layer.

14. The coated phosphor as claimed in claim 1, wherein the non-conductive external layer includes only a single coating material.

15. A process for producing a coated phosphor as claimed in claim 1, comprising the steps of:
   a) providing a phosphor powder as base material;
   b) providing a metal oxide produced by flame hydrolysis as coating material; and
   c) dry-mixing the two materials.

16. A light-emitting device, comprising
   at least one radiation source which emits radiation in the UV region or the visible wavelength region, and
   a phosphor layer which at least partially converts the radiation from the radiation source into radiation with a longer wavelength, the phosphor layer being formed from a coated phosphor as claimed in claim 1.

17. The process as claimed in claim 15, wherein at least some of the individual primary particles of the non-conductive external layer lump together to form aggregates and agglomerates on said base material during said step of dry-mixing.

* * * * *